United States Patent
Huang

(10) Patent No.: US 11,009,641 B2
(45) Date of Patent: May 18, 2021

(54) METHOD FOR PATTERNING FILM LAYER, WIRE GRID POLARIZER AND MANUFACTURING METHOD THEREOF

(71) Applicant: BOE Technology Group Co., Ltd., Beijing (CN)

(72) Inventor: Hua Huang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 330 days.

(21) Appl. No.: 16/038,423

(22) Filed: Jul. 18, 2018

(65) Prior Publication Data
US 2019/0204489 A1 Jul. 4, 2019

(30) Foreign Application Priority Data
Jan. 2, 2018 (CN) .......................... 201810002270.4

(51) Int. Cl.
*G02B 5/30* (2006.01)
*C23F 4/00* (2006.01)
(Continued)

(52) U.S. Cl.
CPC .............. *G02B 5/3058* (2013.01); *C23C 8/02* (2013.01); *C23C 8/04* (2013.01); *C23C 8/10* (2013.01); *C23C 8/24* (2013.01); *C23C 8/80* (2013.01); *C23C 14/48* (2013.01); *C23C 28/00* (2013.01); *C23C 28/32* (2013.01); *C23C 28/34* (2013.01);
(Continued)

(58) Field of Classification Search
None
See application file for complete search history.

(56) References Cited

U.S. PATENT DOCUMENTS 4,275,286 A * 6/1981 Hackett, Jr. ......... H01L 21/0272
219/121.2
6,093,520 A 7/2000 Vladimirsky et al.
(Continued)

FOREIGN PATENT DOCUMENTS

CN 106324742 A 1/2017
CN 107102394 A 8/2017
(Continued)

OTHER PUBLICATIONS

First office action of Chinese application No. 201810002270.4 dated Feb. 3, 2020.

*Primary Examiner* — Derek S. Chapel
(74) *Attorney, Agent, or Firm* — Fay Sharpe LLP

(57) ABSTRACT

A method for patterning film layer, a metal wire grid polarizer and a manufacturing method thereof are provided. The method includes: forming an imprint adhesive layer on a metal layer; imprinting the imprint adhesive layer to form a groove so that part of the metal layer is exposed from the bottom of the groove; performing a surface treatment on the exposed metal layer to form an etching-resist layer on the surface of the exposed metal layer, the etching-resist layer containing an element contained in the metal layer; and etching the imprint adhesive layer and the surface-treated metal layer to remove the imprint adhesive layer and the metal layer whose surface is not formed with the etching-resist layer, to obtain a patterned metal layer, thereby reducing cost and time of the metal layer patterning and improving the patterning accuracy.

14 Claims, 7 Drawing Sheets

(51) Int. Cl.
*C23C 8/04* (2006.01)
*C23C 8/02* (2006.01)
*C23C 8/80* (2006.01)
*C23C 14/48* (2006.01)
*C23C 8/10* (2006.01)
*C23C 28/00* (2006.01)
*C23C 8/24* (2006.01)
*G02F 1/1335* (2006.01)

(52) U.S. Cl.
CPC .............. *C23C 28/345* (2013.01); *C23F 4/00* (2013.01); *G02F 1/133528* (2013.01); *G02F 1/133548* (2021.01)

(56) References Cited

U.S. PATENT DOCUMENTS

| | | | | |
|---|---|---|---|---|
| 2003/0227678 A1* | 12/2003 | Lines | ................... | G02B 5/3058 359/485.05 |
| 2005/0088739 A1 | 4/2005 | Chiu et al. | | |
| 2008/0100779 A1 | 5/2008 | Choo et al. | | |
| 2013/0146902 A1* | 6/2013 | Ryu | ...................... | G02F 1/1333 257/88 |
| 2015/0048048 A1* | 2/2015 | Slafer | ..................... | B29C 41/38 216/26 |
| 2016/0077377 A1* | 3/2016 | Kim | ...................... | G02B 5/3058 349/96 |
| 2016/0124265 A1* | 5/2016 | Lee | ....................... | C25D 11/022 349/43 |
| 2016/0146997 A1* | 5/2016 | Son | ....................... | G02B 5/3058 359/485.05 |
| 2017/0148823 A1* | 5/2017 | Nam | ..................... | H01L 27/1218 |
| 2017/0153372 A1* | 6/2017 | Yang | ..................... | C23C 14/042 |
| 2019/0064406 A1* | 2/2019 | Hou | ....................... | G03F 7/0002 |

FOREIGN PATENT DOCUMENTS

| | | |
|---|---|---|
| CN | 107479121 A | 12/2017 |
| EP | 1635199 A1 | 3/2006 |
| JP | 2010199115 A | 9/2010 |
| TW | 200515012 A | 5/2005 |

* cited by examiner

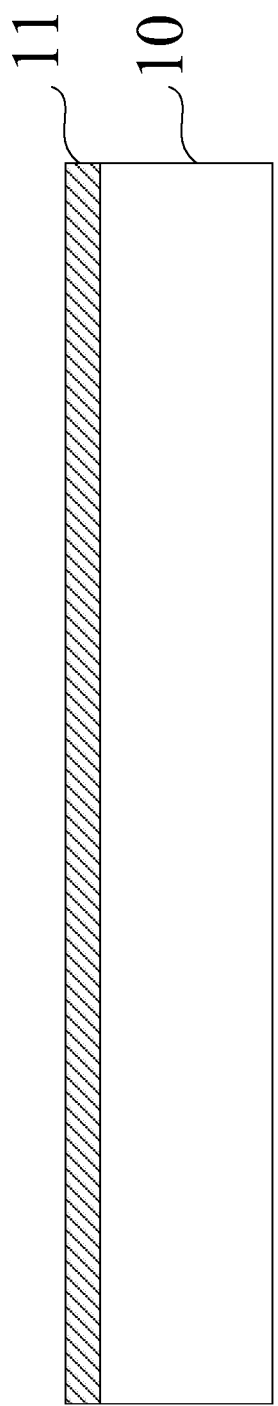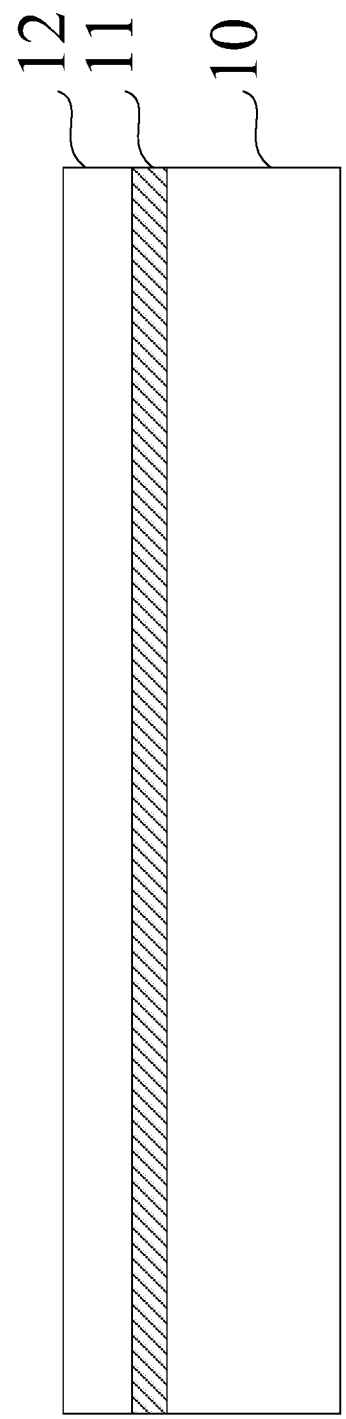

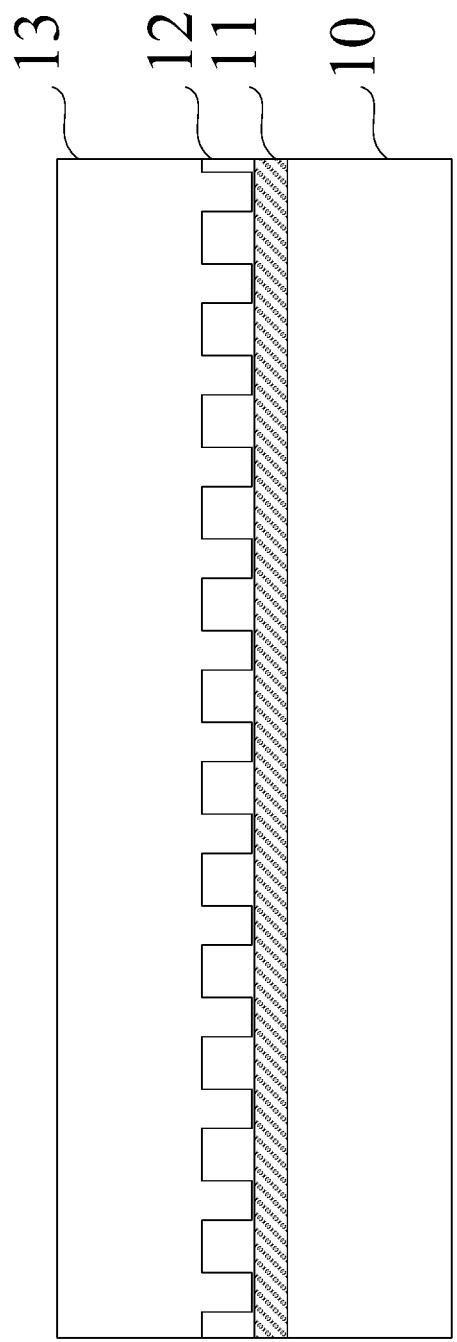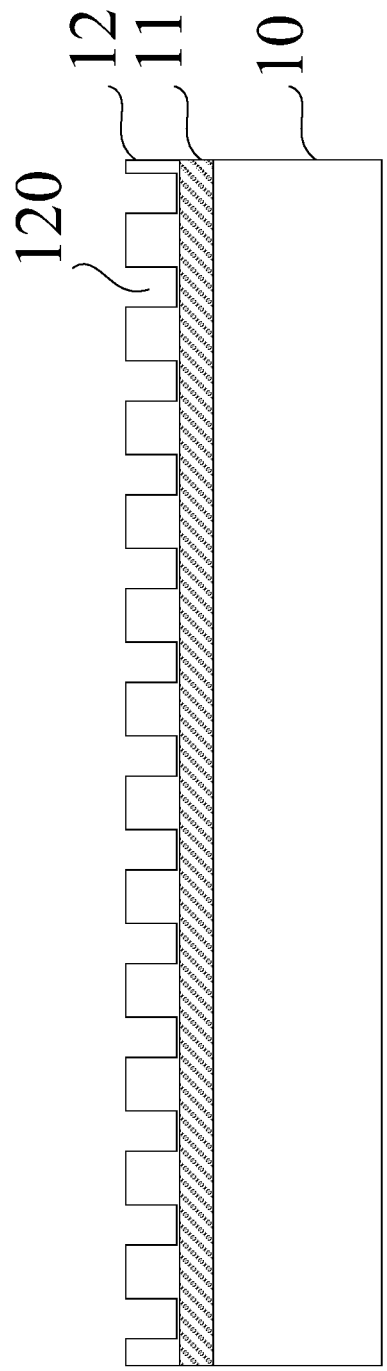

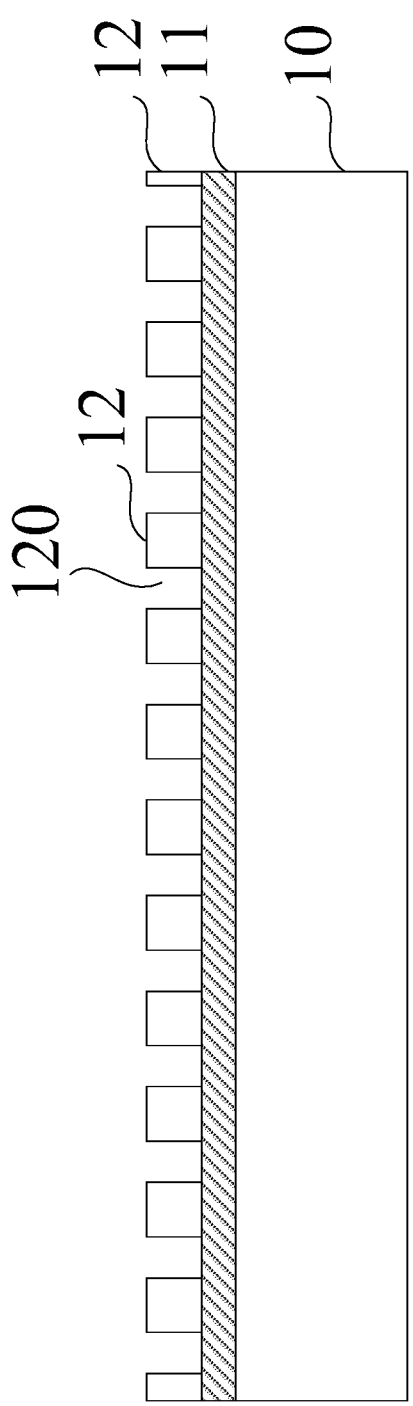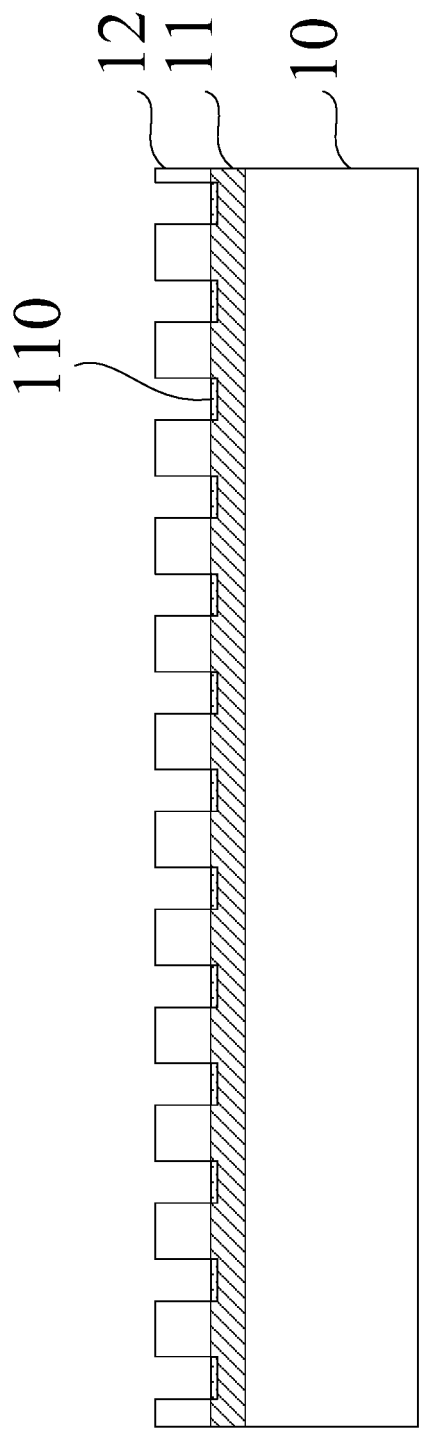

1

METHOD FOR PATTERNING FILM LAYER, WIRE GRID POLARIZER AND MANUFACTURING METHOD THEREOF

TECHNICAL FIELD

This application claims priority to Chinese Patent Application No. 201810002270.4, filed with the State Intellectual Property Office on Jan. 2, 2018 and titled "Method For Patterning Film Layer, Wire Grid Polarizer And Manufacturing Method Thereof", the entire contents of which are incorporated herein by reference.

TECHNICAL FIELD

The present disclosure relates to a method for patterning film layer, a metal wire grid polarizer and a manufacturing method thereof.

BACKGROUND

A wire grid polarizer (WGP) is an optical device composed of a plurality of parallel metal lines. The width of the metal lines in the WGP is nanometer scale, and the length of the metal lines therein is in macroscopic scale, which makes the WGP have a polarizing function. In order to reduce a thickness of a device, an existing liquid crystal display device may use a WGP integrated in a substrate to replace a polarizer additionally attached to the substrate, thereby improving product performance.

An existing method for manufacturing WGP includes: forming a metal layer on a glass substrate; fabricating a $SiO_2$ layer on the metal layer; forming a layer of imprint adhesive on the $SiO_2$ layer; applying a soft template to the imprint adhesive for imprinting and curing, so as to form a plurality of parallel stripe-shaped grooves on the imprint adhesive; dry-etching the $SiO_2$ layer not covered by the imprint adhesive, so as to remove the $SiO_2$ layer not covered by the imprint adhesive and form a $SiO_2$ mask; and etching the metal layer not covered by the $SiO_2$ mask, and then removing the $SiO_2$ mask to obtain a WGP.

In the above process of patterning the metal layer, it is time-consuming and laborious to fabricate a $SiO_2$ mask, and the pattern accuracy of the $SiO_2$ mask is determined by two steps of imprinting and etching of the $SiO_2$ layer. Thus, the accuracy is low, resulting in a low accuracy of the final formed metal layer pattern.

SUMMARY

There are provided in the present disclosure a method for patterning film layer, a wire grid polarizer and a manufacturing method thereof.

There is provided in at least one embodiment of the present disclosure a method for patterning a film layer, including steps of: forming an imprint adhesive layer on a metal layer; imprinting the imprint adhesive layer to form a groove, so that part of the metal layer is exposed from a bottom of the groove; performing a surface treatment on the metal layer that is exposed to form an etching-resist layer on a surface of the metal layer that is exposed, and the etching-resist layer containing an element contained in the metal layer; and etching the imprint adhesive layer and the metal layer on which the surface treatment has been performed to remove the imprint adhesive layer and a metal layer whose surface is not formed with the etching-resist layer, and retaining a metal layer whose surface is formed with the etching-resist layer to obtain a patterned metal layer.

In an implementation of the embodiments of the present disclosure, the step of performing the surface treatment on the metal layer that is exposed includes step of: oxidizing the surface of the metal layer that is exposed to form a metal oxide layer on the surface of the metal layer that is exposed.

Optionally, the step of performing the surface treatment on the metal layer that is exposed includes step of: nitridizing the surface of the metal layer that is exposed to form a metal nitride layer on the surface of the metal layer that is exposed.

In another implementation of the embodiments of the present disclosure, after imprinting the imprint adhesive layer and before performing the surface treatment on the metal layer, the method further includes step of: etching the imprint adhesive layer until part of the metal layer is exposed from the bottom of the groove.

In yet another implementation of the embodiments of the present disclosure, the step of etching the imprint adhesive layer includes step of: etching the imprint adhesive layer through a plasma etching process to remove the imprint adhesive layer at the bottom of the groove.

In still yet another implementation of the embodiments of the present disclosure, an etching gas used in the step of etching the imprint adhesive layer through a plasma etching process includes a mixed gas of methane, boron chloride, and oxygen.

In still yet another implementation of the embodiments of the present disclosure, after etching the imprint adhesive layer, detecting whether the metal layer at the bottom of the groove is exposed.

In still yet another implementation of the embodiments of the present disclosure, the method further includes the step of: etching the imprint adhesive layer again when the metal layer at the bottom of the groove is not exposed.

In still yet another implementation of the embodiments of the present disclosure, the step of etching the imprint adhesive layer and the metal layer on which the surface treatment has been performed includes step of: etching the imprint adhesive layer and the metal layer on which the surface treatment has been performed through a plasma etching process.

In still yet another implementation of the embodiments of the present disclosure, the step of imprinting the imprint adhesive layer to form a groove includes step of: imprinting the imprint adhesive layer with a soft template which is a polydimethylsiloxane template.

In still yet another implementation of the embodiments of the present disclosure, a thickness of the imprint adhesive layer is 50 nm~50 um.

In still yet another implementation of the embodiments of the present disclosure, the metal layer is an aluminum layer.

There is provided in at least one embodiment of the present disclosure a method for manufacturing a wire grid polarizer, including steps of: forming a metal layer on a base substrate; forming an imprint adhesive layer on the metal layer; imprinting the imprint adhesive layer to form a plurality of parallel-spaced strip-shaped grooves, so that the metal layer is exposed from a bottom of the strip-shaped groove; performing a surface treatment on the metal layer that is exposed to form an etching-resist layer on a surface of the metal layer that is exposed, and the etching-resist layer containing an element contained in the metal layer; and etching the imprint adhesive layer and the metal layer on which the surface treatment has been performed to remove the imprint adhesive layer and a metal layer whose surface is not formed with the etching-resist layer, and retaining a metal layer whose surface is formed with the etching-resist layer to obtain a wire grid polarizer.

In an implementation of the embodiments of the present disclosure, the metal layer is an aluminum layer.

In another implementation of the embodiments of the present disclosure, the step of performing the surface treatment on the metal layer that is exposed includes step of: oxidizing the surface of the metal layer that is exposed to form a metal oxide layer on the surface of the metal layer that is exposed.

Optionally, the step of performing surface treatment on the metal layer that is exposed includes step of: nitridizing the surface of the metal layer that is exposed to form a metal nitride layer on the surface of the metal layer that is exposed.

In yet another implementation of the embodiments of the present disclosure, the steps of etching the imprint adhesive layer and the metal layer after surface treatment includes step of: etching the imprint adhesive layer and the metal layer after surface treatment through a plasma etching process.

In still yet another implementation of the embodiments of the present disclosure, the step of imprinting the imprint adhesive layer to form a plurality of parallel-spaced strip-shaped grooves includes step of: imprinting the imprint adhesive layer with a soft template, the soft template being a polydimethylsiloxane template.

There is provided in at least one embodiment of the present disclosure provides a wire grid polarizer, including a plurality of parallel-arranged lines, each of the lines including a metal layer and an etching-resist layer overlying on the metal layer and containing an element contained in the metal layer.

In an implementation of the embodiments of the present disclosure, the etching-resist layer is a metal oxide layer or a metal nitride layer.

In another implementation of the embodiments of the present disclosure, a sum of thicknesses of the metal layer and the etching-resist layer is 50 nm to 200 nm, and the thickness of the etching-resist layer is less than 100 angstroms.

BRIEF DESCRIPTION OF THE DRAWINGS

FIG. 4 to FIG. 10 are schematic diagrams of a structure of a WGP during a manufacturing process provided in an embodiment of the present disclosure.

DETAILED DESCRIPTION

The embodiments of the present disclosure will be described in further detail with reference to the accompanying drawings, to clearly present the principles and advantages of the present disclosure.

Figure 1:
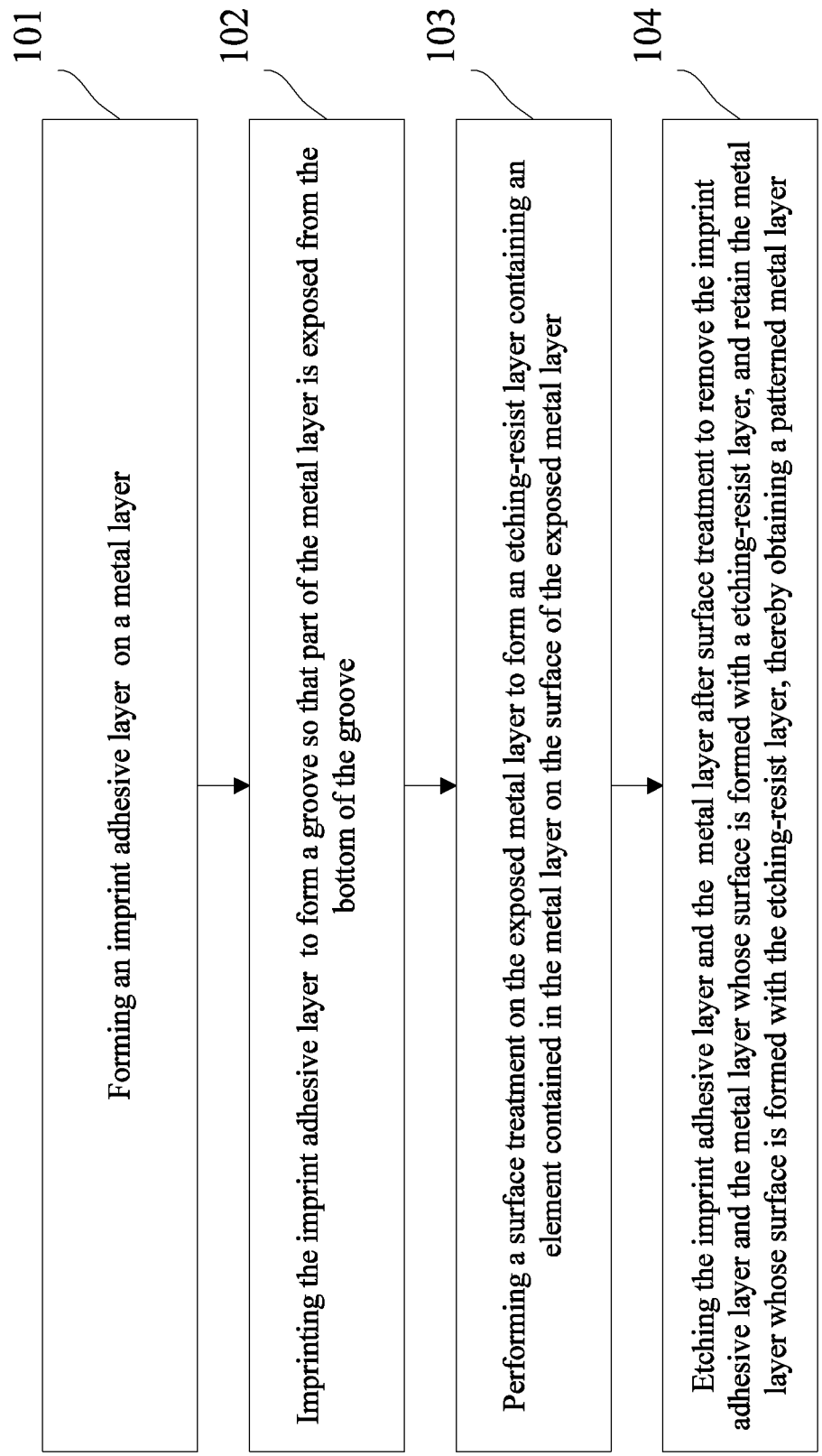
FIG. 1 is a flow chart of a method for patterning a film layer provided in an embodiment of the present disclosure.

FIG. 1 is a flow chart of a method for patterning a film layer provided by an embodiment of the present disclosure. Referring to FIG. 1, the method includes the following steps.

In step 101, an imprint adhesive layer is formed on a metal layer.

In the present embodiment, the metal layer is a metal layer that needs to be patterned. For example, the metal layer may be a metal layer formed on a base substrate for manufacturing a WGP. The metal layer may also be a metal layer used for forming a TFT electrode (such as a gate electrode or a source/drain electrode) in a process of manufacturing a thin film transistor (TFT).

In step 102, the imprint adhesive layer is imprinted to form a groove so that part of the metal layer is exposed from the bottom of the groove.

Exemplarily, the groove may be formed through an imprinting process using a soft template on which an imprint pattern is provided. The imprint pattern is a groove arranged on the surface of the soft template. The shape of the groove is the same as a hollow pattern that needs to be formed on the metal layer. For example, when manufacturing a WGP, the imprint pattern includes a plurality of parallel-spaced grooves.

In step 103, a surface treatment of the exposed metal layer is performed to form an etching-resist layer containing an element contained in the metal layer on the surface of the exposed metal layer.

In this step, the surface treatment is performed on the metal layer so that an etching-resist layer containing an element contained in the metal layer is formed on a surface of the metal layer. In the subsequent processing, the etching-resist layer may be used as a mask.

In step 104, the imprint adhesive layer and the metal layer on which the surface treatment has been performed are etched, so as to remove the imprint adhesive layer and the metal layer whose surface is not formed with the etching-resist layer, but retain the metal layer whose surface is formed with the etching-resist layer, thereby obtaining a patterned metal layer.

In this step, the pattern can be formed on the metal layer by simultaneously removing the imprint adhesive layer and the metal layer that is not covered by the etching-resist layer through one-step etching, and retaining the metal layer covered by the etching-resist layer.

It should be noted that, in addition to patterning a single-layer metal layer, the method for patterning a film layer provided by an embodiment of the present disclosure can also realize a simultaneous patterning operation of a multi-layer film layer. For example, the film layer to be patterned includes a first film layer and a metal layer. After the above steps 101-103, an etching-resist layer can be formed on the metal layer. At this time, the etching-resist layer can be used to etch the metal layer and the first film layer to complete the patterning. Exemplarily, the first film layer may be an insulating layer or the like.

In this method, an etching-resist layer containing an element contained in the metal layer can be formed by performing the surface treatment on the metal layer. The etching-resist layer is used as a mask for subsequent patterning processing to facilitate the mask fabrication. Compared to the fabrication of a $SiO_2$ mask, the cost and time for patterning the metal layer can be reduced. At the same time, when the mask is manufactured, the surface treatment is also performed on the metal layer in the groove directly, so that the position of the mask will not deviate, thereby avoiding the problem of low position accuracy of the $SiO_2$ mask and improving the patterning accuracy of the film layer.

Figure 2:
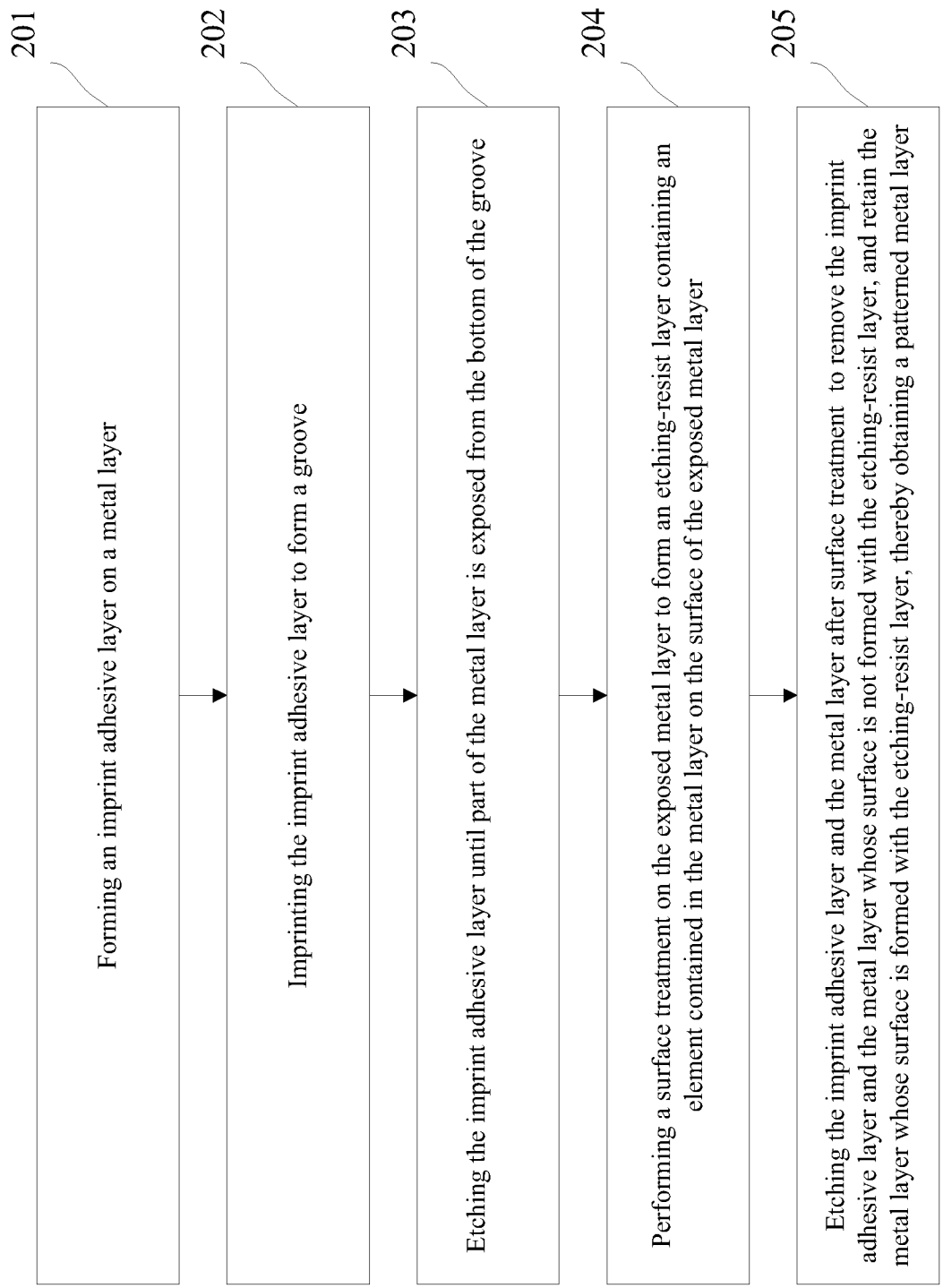
FIG. 2 is a flow chart of another method for patterning a film layer provided in an embodiment of the present disclosure.

FIG. 2 is a flow chart of another method for patterning a film layer provided by an embodiment of the present disclosure. Referring to FIG. 2, the method includes the following steps.

In step 201, an imprint adhesive layer is formed on a metal layer.

Herein, the metal layer is a metal layer that needs to be patterned. For example, the metal layer may be a metal layer formed on a base substrate for manufacturing a WGP. The metal layer may also be a metal layer used for forming a TFT electrode (such as a gate electrode or a source/drain electrode) during the TFT manufacturing. Exemplarily, the metal layer may be an aluminum layer.

In the embodiments of the present disclosure, the imprint adhesive layer may be formed on the metal layer in a deposition manner.

Herein, the imprint adhesive layer may be formed by nanoimprint using an imprint adhesive. Nanoimprint using an imprint adhesive can improve the patterning accuracy. The compositions of the imprint adhesive layer include acrylics, photoinitiators, leveling agents, and the like. The imprinting is convenient and the post-molding curing effect is good by using an imprinting adhesive containing acrylics.

In the embodiments of the present disclosure, a thickness of the imprint adhesive layer may be 50 nm to 50 μm. By using an imprint adhesive layer with such a thickness, the thickness of the imprint adhesive layer is not too thick, which results in the inconvenient subsequent imprinting and etching processes, and the thickness of the imprint adhesive layer is also not too thin, which results in failure to complete the blocking of the metal layer in surface treatment.

In step 202, the imprint adhesive layer is imprinted to form a groove.

In the embodiments of the present disclosure, the imprint adhesive layer may be imprinted and cured by using a soft template, so as to form a groove on the imprint adhesive layer.

In the embodiments of the present disclosure, an imprint pattern is arranged on the soft template. The imprint pattern is a groove arranged on the surface of the soft template. The shape of the groove is the same as a hollow pattern that needs to be formed on the metal layer. For example, when manufacturing a WGP, the imprint pattern includes a plurality of parallel-spaced grooves.

Exemplarily, the soft template may be a polydimethylsiloxane template. Using a soft template that is made of polydimethylsiloxane, it is easy to make an imprint pattern, and then imprint the imprint adhesive.

In step 203, the imprint adhesive layer is etched until part of the metal layer is exposed from the bottom of the groove.

After the imprint adhesive layer is imprinted and cured by using a soft template, although the groove has been formed, there may still remain a certain thickness of imprint adhesive, resulting in that the metal layer in the groove cannot be completely exposed. Since the imprint adhesive still covers the metal layer at some positions in the groove, the imprint adhesive layer needs to be further processed (etched) to make the metal layer in the grooves to be completely exposed. It should be noted that step 203 is an optional step, which is only performed when the imprint adhesive still covers the metal layer at some positions in the groove. Therefore, before the step 203 is performed, it may be first checked whether the metal layer in the groove is exposed completely. If the checked result is that the metal layer in the groove is completely exposed, it is no need to perform the step 203.

In the embodiments of the present disclosure, the step of etching the imprint adhesive layer may include etching the imprint adhesive layer through a plasma etching process to remove the imprint adhesive layer at the bottom of the groove. When the plasma etching process is used to perform etching, the entire layer of the imprint adhesive layer will be etched, and the thickness of the entire layer of the imprint adhesive layer will be reduced. Due to that the thickness of the groove portion of the adhesive layer is much lower than that of the non-groove portion after the imprint adhesive layer is imprinted, the imprint adhesive layer of the non-groove portion still has a certain thickness after the groove portion is etched, which can satisfy the requirements in the following steps of blocking the metal layer.

When the plasma etching is performed on the imprint adhesive layer, the etching gas used herein may include a mixed gas of methane, boron chloride, and oxygen. The abovementioned etching gas is adopted to perform dry-etching on the imprint adhesive, which is not active on the metal layer, i.e., the metal layer will not be etched away, thereby ensuring that the metal layer is not affected.

In the embodiments of the present disclosure, the method further includes the following step of: detecting whether the metal layer at the bottom of the groove is exposed, after the imprint adhesive layer is etched. When the metal layer at the bottom of the groove is not exposed, the imprint adhesive layer can be etched again. Through the above steps of detection and re-etching, the metal layer can be smoothly exposed.

Exemplarily, the step of detecting whether the metal layer at the bottom of the groove is exposed may include: detecting the imprint adhesive layer that is etched by using a microscope to determine whether the metal layer at the bottom of the groove is exposed.

During the above described etching process of the imprint adhesive layer, a total etching time taken from the beginning of etching the imprint adhesive layer until finally completely exposing the metal layer at the bottom of the groove can be recorded. When a film layer of the same structure is subsequently patterned, etching can be performed according to the etching time to achieve one-step etching. It is not necessary to check whether the metal layer at the bottom of the groove is exposed, thereby saving time.

In step 204, the surface treatment is performed on the exposed metal layer, so as to form an etching-resist layer containing an element contained in the metal layer on the surface of the metal layer that is exposed.

In an implementation of an embodiment of the present disclosure, the step 204 may include: oxidizing the surface of the exposed metal layer to form a metal oxide layer on the surface of the exposed metal layer. The metal oxide layer is an implementation of the aforementioned etching-resist layer.

The surface of the exposed metal layer is oxidized as follows: a base substrate having an imprint adhesive layer and a metal layer formed thereon is placed in a chamber, and surface treatment is performed by passing oxygen for more than ten minutes to form a metal oxide layer on the surface of the exposed metal layer. A sufficient surface oxidation of the exposed metal layer can be ensured by placing the base substrate into the chamber for at least 10 minutes. In addition, the process of forming an etching-resist layer in this manner is simple and easy to manufacture. Exemplarily, the chamber for oxidation treatment may be a plasma enhanced chemical vapor deposition chamber.

Exemplarily, the time for oxidation treatment may be 10-20 minutes, such as 10 minutes. On the one hand, the purpose of surface oxidation of the metal layer can be achieved in this oxidation time; on the other hand, a too long oxidation time, which results in a high time cost of the entire production process and a high thickness of the metal oxide layer at the same time, and affects the performance of the metal layer, can be avoided.

In another implementation of an embodiment of the present disclosure, the step 204 may include: performing nitridizing treatment on the surface of the exposed metal layer to form a metal nitride layer on the surface of the exposed metal layer. The metal nitride layer is an implementation of the aforementioned etching-resist layer.

The step of performing nitridizing treatment on the surface of the exposed metal layer is performed as follows: implanting nitrogen ions into the surface of the exposed metal layer by an ion implantation process to form a metal nitride layer on the surface of the exposed metal layer.

In step 205, the imprint adhesive layer and the surface-treated metal layer are etched to remove the imprint adhesive layer and the metal layer whose surface is not formed with the etching-resist layer, and retain the metal layer whose surface is formed with the etching-resist layer, thereby obtaining a patterned metal layer.

In the embodiments of the present disclosure, the step 205 may include the step of: etching the imprint adhesive layer and the surface-treated metal layer through a plasma etching process. The imprint adhesive layer and the metal layer can be simultaneously etched by using the plasma etching technique to remove the remained imprint adhesive layer and the metal layer whose surface is not formed with the etching-resist layer.

In the embodiments of the present disclosure, when the imprint adhesive layer and the surface-treated metal layer are etched, the etching gas used herein may include a mixed gas of methane, boron chloride, and chlorine. The mixed gas is used as an etching gas for etching to ensure that the imprint adhesive layer and the metal layer can be etched simultaneously, but the etching-resist layer is not etched away, thereby forming a patterned metal layer.

In the above manufacturing process, two times of etching are respectively performed in step 203 and step 205. Since it is not required to etch the metal layer in the first etching (step 203) and it is required to etch the metal layer in the second etching (step 205), the etching gases used for the two etchings are different.

By using this method, an etching-resist layer containing an element contained in the metal layer can be formed by performing the surface treatment on the metal layer. The etching-resist layer is used as a mask for subsequent patterning processing to facilitate the mask fabrication. Compared to the fabrication of a $SiO_2$ mask, the cost and time for patterning the metal layer can be reduced. At the same time, when the mask is manufactured, the surface treatment is also performed on the metal layer in the groove directly, so that the position of the mask will not deviate, thereby avoiding the problem of low position accuracy of the $SiO_2$ mask and improving the patterning accuracy of the film layer.

Figure 3:
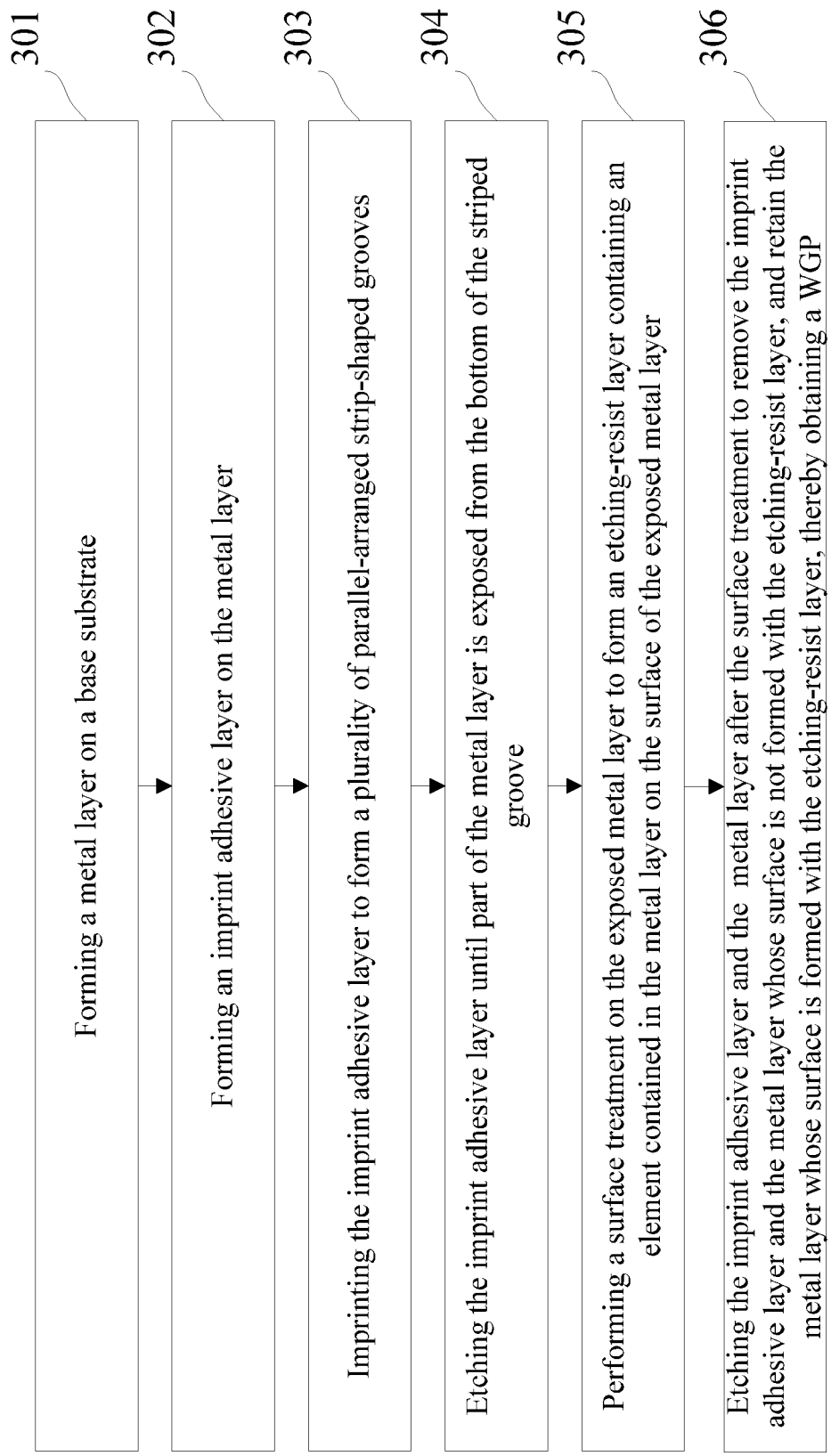
FIG. 3 is a flow chart of a method for manufacturing a WGP provided in an embodiment of the present disclosure.

FIG. 3 is a flowchart of a method for manufacturing WGP provided by an embodiment of the present disclosure. Referring to FIG. 3, the method includes the following steps.

In step 301, a metal layer is formed on a base substrate.

In the embodiments of the present disclosure, the base substrate is a transparent substrate, and may be, for example, a glass substrate, a resin substrate, or the like.

In the embodiments of the present disclosure, the metal layer may be an aluminum layer. The aluminum, which is used as the WGP material, facilitates the etching of the metal layer and facilitates the manufacture of the WGP. Of course, the embodiments of the present disclosure are not limited thereto. The metal layer may also be implemented with other metals.

When an aluminum layer is used as a raw material of WGP, the thickness of the metal layer may be 50-200 nm, which ensures the performance requirement of the produced WGP.

In this step, the metal layer may be formed by sputtering, which is not described here.

As shown in FIG. 4, a base substrate 10 is first provided, and then a metal layer 11 is formed on the base substrate 10.

In step 302, an imprint adhesive layer is formed on the metal layer.

The detailed implementation of the step 302 can refer to the step 201 mentioned above.

As shown in FIG. 5, an imprint adhesive layer 12 is fabricated on the base substrate 10 on which the metal layer 11 is formed.

In step 303, the imprint adhesive layer is imprinted to form a plurality of parallel-arranged strip-shaped grooves.

The detailed implementation of the step 303 can refer to the step 202 mentioned above.

As shown in FIG. 6, the imprint adhesive layer 12 is imprinted and cured by using a soft template 13, so that stripe-shaped grooves are formed on the imprint adhesive layer 12.

In step 304, the imprint adhesive layer is etched until part of the metal layer is exposed from the bottom of the striped groove.

In the step 303 and the step 304, a plurality of parallel-spaced strip-shaped grooves are formed by imprinting and etching the imprint adhesive layer so that part of the metal layer can be exposed from the bottom of the strip-shaped groove.

The detailed implementation of the step 304 can refer to the step 203 mentioned above.

As shown in FIG. 7, after the imprint adhesive layer 12 is imprinted and cured by the soft template 13, although the stripe-shaped grooves 120 are already formed, the metal layer 11 in the grooves may not be completely exposed and the imprint adhesive still covers the metal layer 11 in the groove, it needs to be further processed, so that the metal layer in each groove can be exposed. Referring to FIG. 8, the metal layer 11 under the groove 120 can be exposed by etching the imprint adhesive layer 12.

In step 305, the surface treatment is performed on the exposed metal layer to form an etching-resist layer containing an element contained in the metal layer on the surface of the exposed metal layer.

The detailed implementation of the step 305 can refer to the step 204 mentioned above.

As shown in FIG. 9, the surface treatment is performed on the base substrate 10 having the imprint adhesive layer 12 and the metal layer 11 formed thereon. Due to the presence of the imprint adhesive layer 12 on the metal layer 11, the surface treatment is only performed on the surface of the metal layer 11 exposed from the groove of the imprint adhesive layer 12, rather than the entire layer of the metal layer 11 and, so as to form an etching-resist layer 110 containing an element contained in the metal layer.

In step 306, the imprint adhesive layer and the metal layer on which the surface treatment has been performed are etched, so as to remove the imprint adhesive layer and the metal layer whose surface is not with the etching-resist layer, and retain the metal layer whose surface is formed with the etching-resist layer, thereby obtaining a WGP.

The detailed implementation of the step 306 can refer to the step 205 mentioned above.

Figure 10:
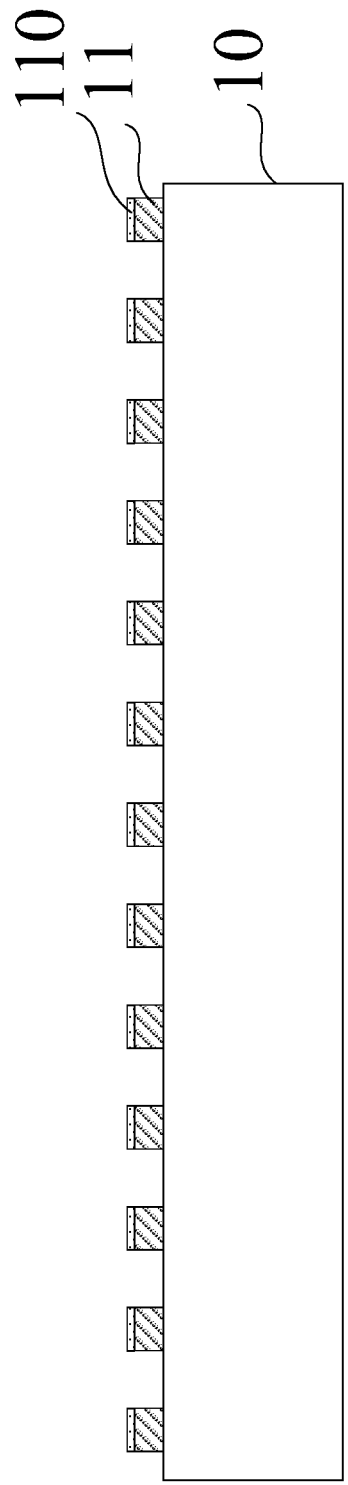

As shown in FIG. 10, the adhesive layer 12 and the metal layer 11 on which the surface treatment has been performed are processed through an etching process, so that the adhesive layer 12 can be completely removed, the surface of the metal layer 11 without the etching-resist layer formed thereon can be removed, and the surface of the metal layer 11 with the etching-resist layer 110 formed thereon can be retained, thereby obtaining a WGP.

In this solution, an etching-resist layer containing an element contained in the metal layer can be formed by performing surface treatment on the metal layer. The etching-resist layer is used as a mask for subsequent patterning processing to facilitate the mask fabrication. Compared to the fabrication of a $SiO_2$ mask, the cost and time for patterning the metal layer can be reduced. At the same time, when the mask is manufactured, the surface treatment is also performed on the metal layer in the groove directly, so that the position of the mask will not deviate, thereby avoiding the problem of low position accuracy of the $SiO_2$ mask and improving the production yield of the WGP.

Figure 11:
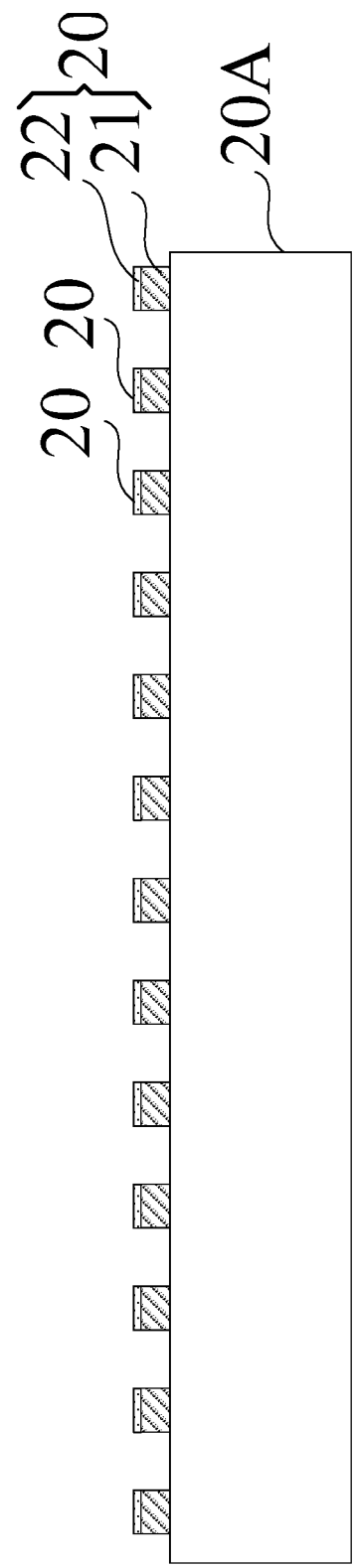
FIG. 11 is a schematic diagram of a structure of a WGP provided in an embodiment of the present disclosure.

FIG. 11 is a schematic diagram of a structure of a WGP provided by an embodiment of the present disclosure. Referring to FIG. 11, the WGP includes a plurality of parallel-arranged lines 20, each of which includes a metal layer 21 and an etching-resist layer 22 overlying on the metal layer 21 and containing an element included in the metal layer.

In the embodiments of the present disclosure, the etching-resist layer 22 may be a metal oxide layer or a metal nitride layer. A metal oxide layer or a metal nitride layer can be used as an etching-resist layer herein, on the one hand, it can be obtained by performing the surface treatment on the metal layer, and on the other hand, it has stable properties and can be used as a mask.

In the embodiments of the present disclosure, the metal layer 21 may be an aluminum layer. The aluminum, which is used as the WGP material, facilitates the etching of the metal layer and facilitates the manufacture of the WGP. Of course, the embodiments of the present disclosure are not limited thereto. The metal layer may also be implemented with other metals. Correspondingly, the etching-resist layer 22 may be an aluminum oxide layer or an aluminum nitride layer.

In the embodiments of the present disclosure, a sum of the thicknesses of the metal layer 21 and the etching-resist layer 22 can be 50 nm to 200 nm, and a thickness of the etching-resist layer 22 is less than 100 Angstroms. Such a thickness design satisfies the performance requirement of the WGP (such as the thickness of the metal in the lines of the WGP), and under the premise of ensuring that the etching-resist layer 22 can achieve a masking function, avoids affecting the performance of the WGP due to the thickness of the etching-resist layer 22 being too large.

Further, the WGP further includes a base substrate 20A. A line 20 is provided on the base substrate 20A. The base substrate 20A is a transparent substrate and may be, for example, a glass substrate, a resin substrate, or the like.

In this solution, an etching-resist layer containing an element contained in the metal layer can be formed by performing surface treatment on the metal layer. The etching-resist layer is used as a mask for subsequent patterning processing to facilitate the mask fabrication. Compared to the fabrication of a $SiO_2$ mask, the cost and time for patterning the metal layer can be reduced. At the same time, when the mask is manufactured, the surface treatment is also performed on the metal layer in the groove directly, so that the position of the mask will not deviate, thereby avoiding the problem of low position accuracy of the $SiO_2$ mask and improving the production yield of the WGP.

The foregoing descriptions are merely exemplary embodiments of the present disclosure, and are not intended to limit the present disclosure. Any modification, equivalent substitution, improvement, etc., within the spirits and principles of the disclosure, falls into the protection scope defined by the appended claims of the present disclosure.

What is claimed is:

1. A method for patterning a film layer, comprising steps of:
    forming an imprint adhesive layer on a metal layer;
    imprinting the imprint adhesive layer to form a groove, so that part of the metal layer is exposed from a bottom of the groove;
    performing a surface treatment on the metal layer that is exposed to form an etching-resist layer on a surface of the metal layer that is exposed, and the etching-resist layer containing an element contained in the metal layer; and
    etching the imprint adhesive layer and the metal layer on which the surface treatment has been performed to remove the imprint adhesive layer and a metal layer whose surface is not formed with the etching-resist layer, and retaining a metal layer whose surface is formed with the etching-resist layer to obtain a patterned metal layer,
    wherein after imprinting the imprint adhesive layer and before performing the surface treatment on the metal layer, the method further comprises a step of etching the imprint adhesive layer until part of the metal layer is exposed from the bottom of the groove, and the step of etching the imprint adhesive layer comprises a step of etching the imprint adhesive layer through a plasma etching process to remove the imprint adhesive layer at the bottom of the groove, wherein an etching gas used in the step of etching the imprint adhesive layer through a plasma etching process comprises a mixed gas of methane, boron chloride, and oxygen.

2. The method according to claim 1, wherein the step of performing the surface treatment on the metal layer that is exposed comprises a step of:
    oxidizing the surface of the metal layer that is exposed to form a metal oxide layer on the surface of the metal layer that is exposed.

3. The method according to claim 1, wherein the step of performing the surface treatment on the metal layer that is exposed comprises a step of:
    nitridizing the surface of the metal layer that is exposed to form a metal nitride layer on the surface of the metal layer that is exposed.

4. The method according to claim 1, further comprising: after etching the imprint adhesive layer, detecting whether the metal layer at the bottom of the groove is exposed.

5. The method according to claim 4, further comprising the step of: etching the imprint adhesive layer again when the metal layer at the bottom of the groove is not exposed.

6. The method according to claim 1, wherein the step of etching the imprint adhesive layer and the metal layer on which the surface treatment has been performed comprises a step of:
    etching the imprint adhesive layer and the metal layer on which the surface treatment has been performed through a plasma etching process.

7. The method according to claim 1, wherein the step of imprinting the imprint adhesive layer to form a groove comprises a step of:
   imprinting the imprint adhesive layer with a soft template which is a polydimethylsiloxane template.

8. The method according to claim 1, wherein the metal layer is an aluminum layer.

9. A method for manufacturing a wire grid polarizer, comprising steps of:
   forming a metal layer on a base substrate;
   forming an imprint adhesive layer on the metal layer;
   imprinting the imprint adhesive layer to form a plurality of parallel-spaced strip-shaped grooves, so that the metal layer is exposed from a bottom of the strip-shaped groove;
   performing a surface treatment on the metal layer that is exposed to form an etching-resist layer on a surface of the metal layer that is exposed, and the etching-resist layer containing an element contained in the metal layer; and
   etching the imprint adhesive layer and the metal layer on which the surface treatment has been performed to remove the imprint adhesive layer and a metal layer whose surface is not formed with the etching-resist layer, and retaining a metal layer whose surface is formed with the etching-resist layer to obtain a wire grid polarize,
   wherein after imprinting the imprint adhesive layer and before performing the surface treatment on the metal layer, the method further comprises a step of etching the imprint adhesive layer until part of the metal layer is exposed from the bottom of the groove, and the step of etching the imprint adhesive layer comprises a step of etching the imprint adhesive layer through a plasma etching process to remove the imprint adhesive layer at the bottom of the groove, wherein an etching gas used in the step of etching the imprint adhesive layer through a plasma etching process comprises a mixed gas of methane, boron chloride, and oxygen.

10. The method according to claim 9, wherein the metal layer is an aluminum layer.

11. The method according to claim 9, wherein the step of performing the surface treatment on the metal layer that is exposed comprises a step of:
    oxidizing the surface of the metal layer that is exposed to form a metal oxide layer on the surface of the metal layer that is exposed.

12. The method according to claim 9, wherein the step of performing surface treatment on the metal layer that is exposed comprises a step of:
    nitridizing the surface of the metal layer that is exposed to form a metal nitride layer on the surface of the metal layer that is exposed.

13. The method according to claim 9, wherein the steps of etching the imprint adhesive layer and the metal layer after surface treatment comprises a step of:
    etching the imprint adhesive layer and the metal layer after surface treatment through a plasma etching process.

14. The method according to claim 9, wherein the step of imprinting the imprint adhesive layer to form a plurality of parallel-spaced strip-shaped grooves comprises a step of:
    imprinting the imprint adhesive layer with a soft template, the soft template being a polydimethylsiloxane template.

* * * * *